United States Patent [19]

Ishii

[11] Patent Number: 5,324,677
[45] Date of Patent: Jun. 28, 1994

[54] METHOD OF MAKING MEMORY CELL AND A PERIPHERAL CIRCUIT

[75] Inventor: Kazutoshi Ishii, Tokyo, Japan

[73] Assignee: Seiko Instruments Inc., Japan

[21] Appl. No.: 622,263

[22] Filed: Dec. 5, 1990

Related U.S. Application Data

[63] Continuation-in-part of Ser. No. 364,267, Jun. 9, 1989, abandoned.

[30] Foreign Application Priority Data

Jun. 15, 1988 [JP] Japan .................................. 63-147779

[51] Int. Cl.[5] .......................................... H01L 21/265
[52] U.S. Cl. .......................................... 437/43; 437/931
[58] Field of Search ................... 437/43, 48, 983, 931, 437/29

[56] References Cited

U.S. PATENT DOCUMENTS

| | | | |
|---|---|---|---|
| 4,019,197 | 4/1977 | Lohstroh et al. | 357/23 |
| 4,288,863 | 9/1981 | Adam | 365/182 |
| 4,300,212 | 11/1981 | Simko | 365/185 |
| 4,404,577 | 9/1983 | Cranford et al. | 357/23.5 |
| 4,516,313 | 5/1985 | Turi et al. | 357/23.5 |
| 4,616,245 | 10/1986 | Topich et al. | 357/235 |
| 4,727,043 | 2/1988 | Matsumoto et al. | 437/931 |
| 4,816,894 | 3/1989 | Hattori | 357/23.5 |
| 4,851,361 | 7/1989 | Schumann et al. | 437/30 |

FOREIGN PATENT DOCUMENTS

| | | |
|---|---|---|
| 0044384 | 1/1982 | European Pat. Off. . |
| 0120303 | 10/1984 | European Pat. Off. . |
| 0268315 | 5/1988 | European Pat. Off. . |
| 0026129 | 2/1977 | Japan .................... 357/23.5 |
| 57-018367 | 1/1982 | Japan .................... 357/23.5 |
| 0194565 | 11/1982 | Japan .................... 357/23.5 |
| 0105576 | 6/1983 | Japan .................... 357/23.5 |
| 58-158973 | 9/1983 | Japan .................... 357/23.5 |
| 60-258968 | 12/1985 | Japan . |
| 63-283071 | 11/1988 | Japan .................... 357/23.5 |

OTHER PUBLICATIONS

Patent Abstracts of Japan, vol. 10, No. 129 (E-103) [2186] May 14, 1986.

Primary Examiner—George Fourson
Assistant Examiner—Richard A. Booth
Attorney, Agent, or Firm—Bruce L. Adams; Van C. Wilks

[57] ABSTRACT

A semiconductor nonvolatile memory device of the gate insulating type is comprised of a semiconductor substrate, an electrically erasable programmable memory cell having a gate oxide film disposed on the substrate, a floating gate electrode formed on the gate oxide film, and a control gate electrode formed in the substrate under the gate oxide film and separated from the floating gate electrode through the gate oxide film so as to control potential level of the floating gate electrode to effect writing and erasing operation of the memory cell, and a peripheral circuit including a transistor of the gate insulating type having another gate oxide film disposed on the same substrate and formed concurrently with the first mentioned gate oxide film.

13 Claims, 5 Drawing Sheets

METHOD OF MAKING MEMORY CELL AND A PERIPHERAL CIRCUIT

This is a Rule 62 division of parent application Ser. No. 364,267 filed Jun. 9, 1989, now abandoned.

BACKGROUND OF THE INVENTION

The present invention relates to a semiconductor nonvolatile memory of the floating gate type operable to electrically effect writing and erasing of data.

FIG. 4 is a sectional view of a memory cell of the conventional nonvolatile memory operable to electrically effect writing and erasing of data (hereinafter, referred to as an "EEPROM"). FIG. 5 is a sectional view of a peripheral circuit of the conventional nonvolatile memory operable to electrically effect writing and erasing of data.

Firstly, the memory cell of FIG. 4 is briefly explained. A source region 102 of N+ type, a drain region 103 of N+ type and a tunnel-drain region 123 of N+ type are concurrently formed in a surface portion of P type semiconductor substrate 101. Then, a gate electrode 125 of the memory cell is formed on the substrate through a gate oxide film 104 of the memory cell, and at the same time a floating gate electrode 105 is formed on the substrate through a tunnel oxide film 106. Further, a control gate electrode 107 is formed on the floating gate electrode 105 through second gate oxide film 109 so as to control the potential level of the floating gate electrode 105. The injecting and extracting operations of electric charge to and from the floating gate electrode 105 are carried out through the tunnel oxide film 106 formed on the tunnel-drain region 123.

Next, the peripheral circuit of FIG. 5 is briefly explained. An n-well region 110 and a field oxide film 111 are formed in the P type silicon substrate 101. An N+ type source region 112 and N+ type drain region 113 are formed in a P type region of the P type silicon substrate 101, and a gate electrode 115 is formed thereon through a gate oxide film 114. A P+ type source region 116 and P+ type drain region 117 are formed in the n-well region 110, and another gate electrode 115 is formed thereon through the gate oxide film 114. The second gate oxide film 109 of the memory cell is formed concurrently with the gate oxide film 114 of the peripheral circuit.

As shown in FIG. 4, since the second gate oxide film 109 of the memory cell is formed on the floating gate electrode 105 composed of polysilicon layer, the second gate oxide film 109 must undergo a heating process above a temperature of 1050° C. in order to improve its film quality. However, when carrying out the heating process over 1050° C. after forming the tunnel oxide film 106 under the floating gate electrode 105, the film quality of the oxide film 106 is degraded which causes the drawback that the writing feature of the EEPROM is impaired. The possible repetition cycles of the writing operation in the conventional EEPROM is illustrated in FIG. 3 as dushed lines, in which the abscissa indicates the repetition cycle number of alternate writing and erasing operations and the ordinate indicates threshold voltage $V_{th}$.

SUMMARY OF THE INVENTION

The object of the present invention is to, therefore, eliminate the above noted drawback of the prior art. According to the inventive EEPROM structure, a control gate electrode is formed within the P type silicon substrate for controlling the potential level of a floating gate electrode so as to eliminate the second gate oxide film formed by a high temperature heating process (more than 1050° C.) on the floating gate electrode.

As described above, by eliminating the formation of the second gate oxide film formed by the high temperature heating process on the floating gate electrode, the film quality of the tunnel oxide film can be improved. Accordingly, the inventive EEPROM having the improved tunnel oxide film exhibits a greater number of writing repetition cycles as shown by solid lines in FIG. 3 than that of the conventional EEPROM.

DETAILED DESCRIPTION OF THE PREFERRED EMBODIMENTS

Figure 1:
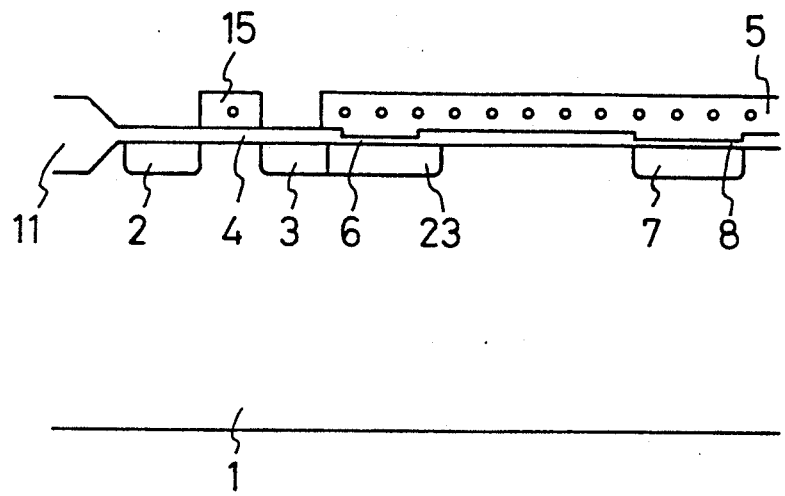
FIG. 1 is a sectional view of a memory cell of a semiconductor nonvolatile memory according to the present invention.
Figure 2:
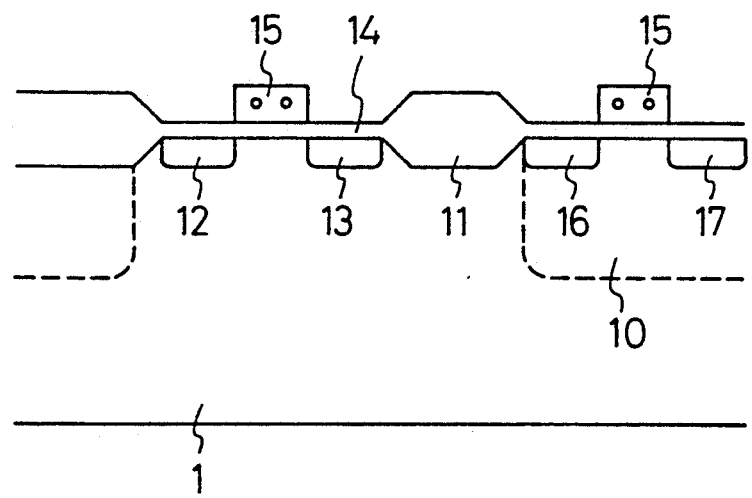
FIG. 2 is a sectional view of a peripheral circuit of the same memory.

Hereinafter, embodiments of the invention will be explained in conjunction with the drawings in which FIG. 1 shows a sectional view of a memory cell of the inventive semiconductor nonvolatile memory and FIG. 2 shows a sectional view of a peripheral circuit of the same inventive semiconductor nonvolatile memory.

Firstly, the memory of the FIG. 1 embodiment is explained. An N+ type source region 2 and N+ type drain region 3 including a contiguous tunnel-drain region 23 are formed in a surface portion of P type silicon substrate 1, and a floating gate electrode 5 is formed thereon through a gate oxide insulating film 4. Injecting and extracting operations of electric charge to and from the floating gate electrode 5 are carried out through a tunnel oxide film 6 formed on the tunnel-drain region 23 so as to effect writing and erasing of bit data. Further, a control gate electrode 7 is formed within the P type silicon substrate 1 under the floating gate electrode 5 through a thin oxide film 8 so as to control the potential level of floating gate electrode 5. The thin oxide film 8 is formed concurrently with the tunnel oxide film 6.

Next, the peripheral circuit of the FIG. 2 embodiment will be explained. An n-well region 10 and field oxide film 11 are formed in the surface portion of common P type silicon substrate 1. An N+ type source region 12 and N+ type drain region 13 are formed within the P type surface region of P type silicon substrate 1, and a gate electrode 15 is disposed thereon through a gate oxide insulating film 14 and is formed concurrently with the floating gate electrode 5. A P+ type source region 16 and P+ type drain region 17 are formed within the n-well region 10, and another corresponding gate electrode 15 is formed thereon through the gate oxide film 14. The gate oxide film 14 of the peripheral circuit is concurrently formed with the gate oxide film 4 of the memory cell. As described above, the peripheral circuit is comprised of complementary MOS transistors effective to drive the memory cell.

As described above, since the control gate electrode 7 is formed within the P type silicon substrate 1 for controlling the potential level of the floating gate electrode 5, a second gate oxide film which would be formed by a heating process at high temperature (more than 1050° C.) on the floating gate electrode in the prior art structure can be eliminated to thereby avoid degradation of the film dielectric quality of the tunnel oxide film 6 which would otherwise be caused by a high temperature heating process (more than 1050° C.).

Figure 3:
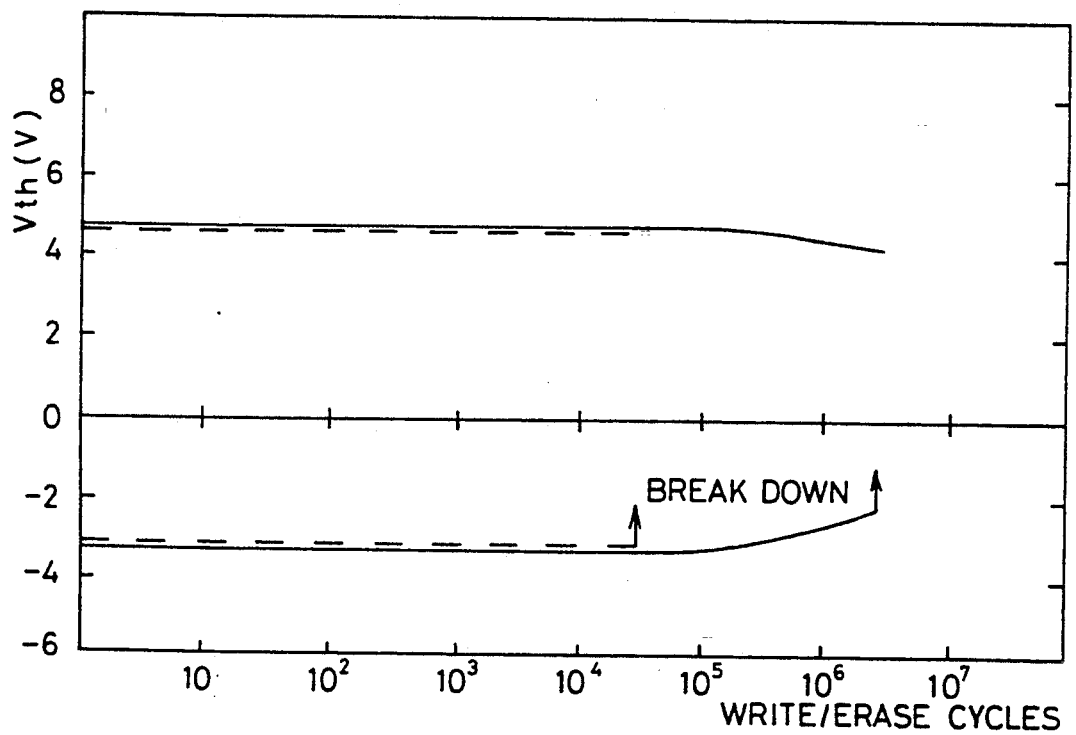
FIG. 3 is a diagram showing the writing and erasing repetition characteristics of the semiconductor nonvolatile memory.
Figure 4:
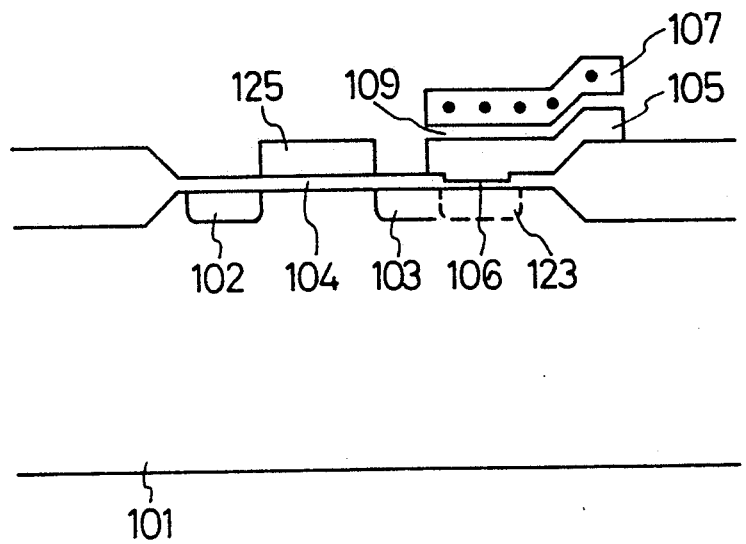
FIG. 4 is a sectional view of a memory cell of the conventional semiconductor nonvolatile memory.
Figure 5:
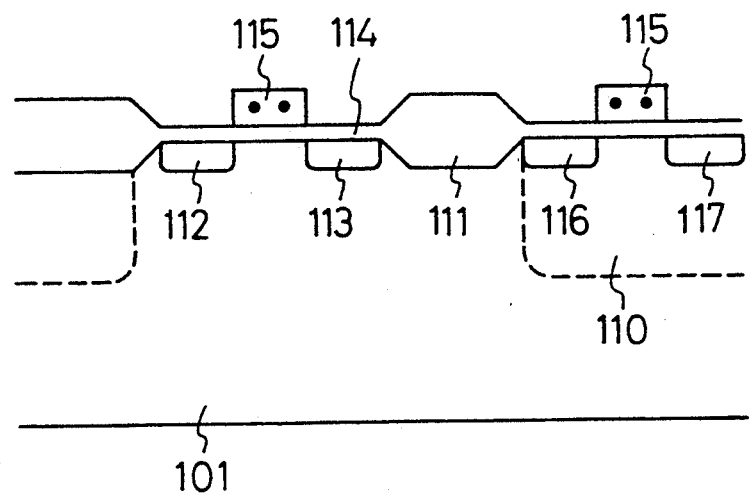
FIG. 5 is a sectional view of a peripheral circuit of the same conventional memory.

The repetition cycles of alternate writing and erasing operation according to the present invention is illustrated in FIG. 3 by solid lines. As seen from FIG. 3, the reliability or durability of the inventive EEPROM is greatly improved as compared to the prior art EEPROM with respect to the writing and erasing characteristic.

In the inventive EEPROM, a gate oxide film is concurrently formed in the memory cell and peripheral circuit, and the control gate electrode is formed within the semiconductor substrate so as to eliminate a high temperature thermal oxidation step after the formation of the floating gate electrode. By such construction, the film quality of the tunnel oxide film can be improved to increase the possible repetition cycle number of alternate writing and erasing operations as compared to the conventional structure.

Figure 6A:
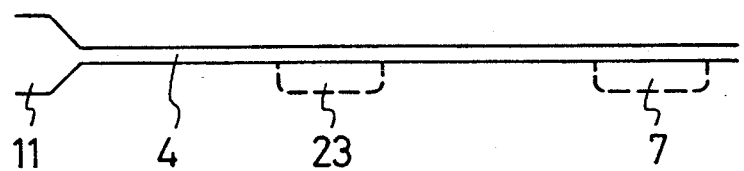
FIGS. 6A to 6C are production step charts of the FIG. 1 memory cell.
Figure 6B:
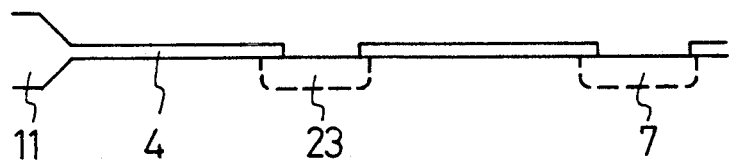
Figure 6C:
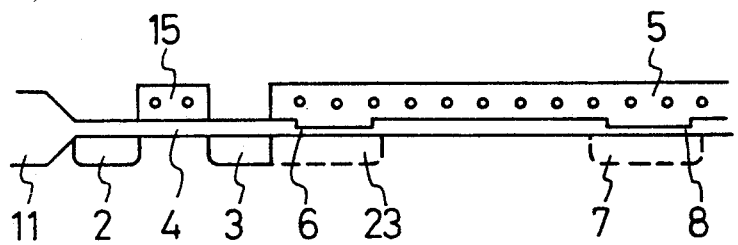
Figure 7A:
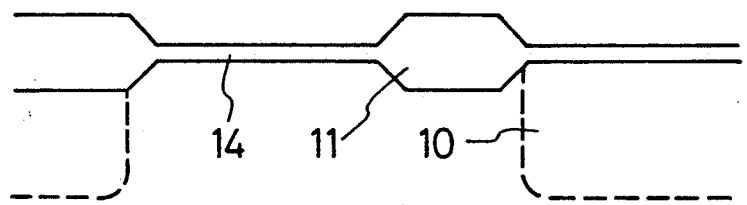
FIGS. 7A to 7C are production step charts of the FIG. 2 peripheral circuit.
Figure 7A:
Figure 7B:
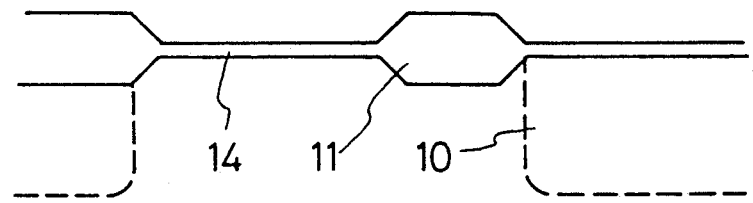
Figure 7B:
Figure 7C:
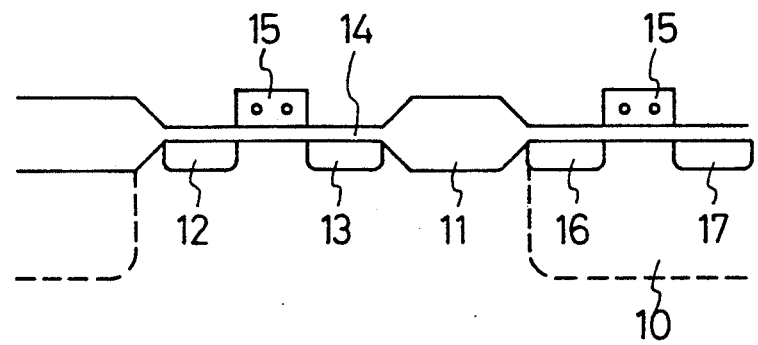
Figure 7C:
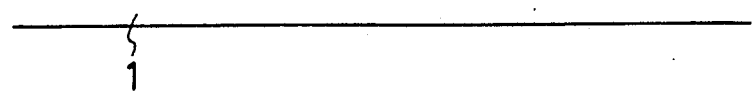

Lastly, the fabrication method of the inventive EEPROM is described with reference to the drawings in which FIGS. 6A-6C show the fabrication steps of the memory cell and FIGS. 7A-7C show the fabrication steps of the peripheral circuit, and the memory cell and peripheral circuit are concurrently formed with each other on the common semiconductor substrate.

Referring to FIGS. 6A and 7A, the n-well region 10 and field oxide film 11 are formed in the P type silicon substrate 1. Then, the gate oxide films 4 and 14 are concurrently formed on the substrate, and thereafter the N+ type tunnel-drain region 23 and N+ type control gate electrode 7 are formed within the surface region of substrate under the gate oxide film.

Next referring to FIGS. 6B and 7B, the gate oxide film 4 is selectively etched to remove a part thereof over the N+ type tunnel-drain region 23 and N+ type control gate electrode 7.

Lastly referring to FIGS. 6C and 7C, the tunnel oxide film 6 and the thin oxide film 8 are concurrently formed on the N+ type tunnel-drain region 23 and the N+ type control gate electrode 7, respectively. Thereafter, the floating gate electrode 5 and an adjacent transistor gate electrode 15 are concurrently formed within the memory cell. Further, N+ type source regions 2 and 12 and N+ type drain regions 3 and 13 are formed in the P type surface region of P type silicon substrate 1, and P+ type source region 16 and P+ type drain region 17 are formed within the n-well region 10.

What is claimed is:

1. A method of making a nonvolatile semiconductor having a memory cell with a floating gate and a peripheral circuit, comprising the steps of:

forming concurrently a gate oxide film of the memory cell and a gate oxide film of the peripheral circuit on a substrate after forming a field oxide film on the substrate;

forming a tunnel-drain region and a control gate electrode of the memory cell within a surface region of the substrate under the gate oxide film of the memory cell;

etching selectively the gate oxide film of the memory cell to remove a part thereof over the tunnel-drain region and the control gate electrode;

forming concurrently a tunnel oxide on the tunnel-drain region and a thin oxide film on the control gate electrode;

forming concurrently a gate electrode of the peripheral circuit and a floating gate electrode and a gate electrode of the memory cell; and forming source regions and drain regions of the peripheral circuit in the surface region of the substrate.

2. A method according to claim 1; wherein the tunnel-drain region and the control gate electrode of the memory cell are formed concurrently.

3. A method according to claim 1; wherein following the step of forming concurrently the tunnel oxide and the thin oxide film, the substrate is not thereafter subjected to a high temperature thermal process carried out at a temperature high enough to degrade the tunnel oxide.

4. A method according to claim 3; wherein the temperature high enough is a temperature of more than 1050° C.

5. A method of fabricating a nonvolatile semiconductor memory cell and a peripheral circuit, comprising the steps of:

concurrently forming on a substrate in the same heating process a gate oxide film of the memory cell and a gate oxide film of the peripheral circuit;

forming a tunnel-drain region and a control gate electrode of the memory cell in surface portions of the substrate beneath the gate oxide film of the memory cell;

selectively etching the gate oxide film of the memory cell to expose the tunnel-drain region and the control gate electrode;

concurrently forming a tunnel oxide film on the tunnel-drain region and an oxide film on the control gate electrode;

forming a gate electrode of the peripheral circuit on the gate oxide film concurrently with forming a floating gate electrode of the memory cell on both the tunnel oxide film and the oxide film;

forming a gate electrode of the memory cell on the gate oxide film; and forming source and drain regions of the peripheral circuit in spaced-apart relation in a surface portion of the substrate beneath the gate oxide film of the peripheral circuit.

6. A method according to claim 5; wherein the floating gate electrode and the gate electrode of the memory cell are formed concurrently.

7. A method according to claim 5; wherein the step of forming source and drain regions of the peripheral circuit comprises forming pairs of spaced-apart source and drain regions of complementary MOS transistors.

8. A method according to claim 5; including forming a field oxide film on the substrate prior to formation of the gate oxide films.

9. A method according to claim 5; wherein the tunnel-drain region and the control gate electrode of the memory cell are formed concurrently.

10. A method according to claim 5; including maintaining the substrate, after formation of the tunnel oxide film, at a temperature low enough to prevent thermal degradation of the tunnel oxide film.

11. A method according to claim 8; wherein the floating gate electrode and the gate electrode of the memory cell are formed concurrently.

12. A method according to claim 11; wherein the step of forming source and drain regions of the peripheral circuit comprises forming pairs of spaced-apart source and drain regions of complementary MOS transistors.

13. A method according to claim 10; wherein the step of maintaining comprises maintaining the substrate at a temperature of not more than 1050° C.

* * * * *